(12) United States Patent
Hammerschmidt et al.

(10) Patent No.: US 7,633,039 B2
(45) Date of Patent: Dec. 15, 2009

(54) SENSOR DEVICE AND A METHOD FOR MANUFACTURING THE SAME

(75) Inventors: Dirk Hammerschmidt, Hohlweg (AT); Wolfgang Granig, Sachsenburg (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 11/469,245

(22) Filed: Aug. 31, 2006

(65) Prior Publication Data
US 2008/0083742 A1 Apr. 10, 2008

(51) Int. Cl.
*H05B 3/02* (2006.01)
(52) U.S. Cl. .................. 219/538; 219/635; 219/697; 219/645; 219/618; 219/619
(58) Field of Classification Search ............... 219/538, 219/635, 697, 645, 618–9
See application file for complete search history.

(56) References Cited

U.S. PATENT DOCUMENTS

| | | | |
|---|---|---|---|
| 6,603,678 B2 | 8/2003 | Nickel et al. | |
| 7,133,254 B2 * | 11/2006 | Hamann et al. | 360/125.74 |
| 2003/0198113 A1 | 10/2003 | Abraham et al. | |
| 2004/0040847 A1 * | 3/2004 | Suzuki | 204/426 |
| 2005/0248981 A1 | 11/2005 | Ohmori | |
| 2006/0043444 A1 | 3/2006 | Nickel | |
| 2006/0083056 A1 | 4/2006 | Daughton et al. | |

FOREIGN PATENT DOCUMENTS

| | | |
|---|---|---|
| DE | 4326681 | 3/1994 |
| DE | 19520206 | 12/1996 |
| DE | 20117517 | 3/2002 |
| DE | 102004033743 | 6/2005 |
| DE | 102004032483 | 1/2006 |
| DE | 602004009998 | 9/2008 |
| EP | 0622637 | 11/1994 |
| EP | 1566649 | 8/2005 |

OTHER PUBLICATIONS 102007041266.7, "German Application Serial No. 102007041266.7 Office action mailed Jan. 23, 2009", 9.
102007041266.7, "Germany Application serial no - 102007041266.7 , office action mailed Jun 17,2009",6.

* cited by examiner

*Primary Examiner*—Shawntina Fuqua
(74) *Attorney, Agent, or Firm*—Schwegman, Lundberg & Woessner, P.A.

(57) ABSTRACT

Embodiments discussed herein relate to sensor devices and processes of producing them. Some embodiments include a sensor device with a substrate with a sensing element mounted above the substrate, with a heating element, mounted substantially coplanar to the sensing element; and with a heat spreading element, the heat spreading element thermally coupling the sensing element and the heating element.

21 Claims, 3 Drawing Sheets

SENSOR DEVICE AND A METHOD FOR MANUFACTURING THE SAME

TECHNICAL FIELD

The various embodiments described herein relate to the manufacture and structure of sensor devices in general and with magnetic sensor devices in particular.

TECHNICAL BACKGROUND

The subject matter described herein deals with heat management in sensor devices.

DETAILED DESCRIPTION

Figure 1:
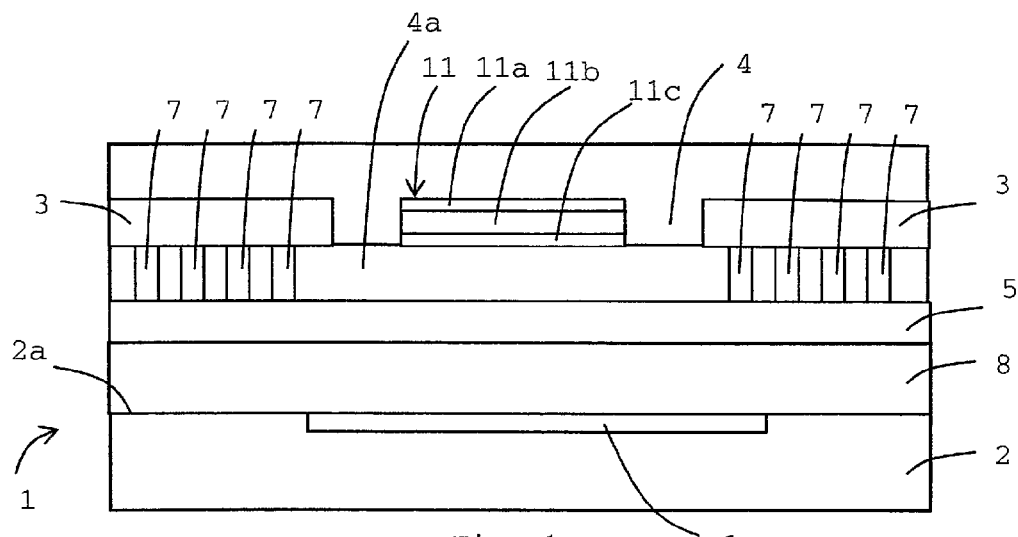
FIG. 1 is a schematic cross section of some embodiments of the invention.

FIG. 1 shows a schematic cross section through some embodiments of a sensor device 1. A heating element 3, a sensing element 11, and a heat spreading element 5 are shown mounted above a substrate 2. In some embodiments the sensing element 11 and the heating element 3 are mounted substantially coplanar to each other above an isolation layer 4a. In some embodiments, at least one heating element 3 is thermally coupled to a sensing element 11.

The isolation layer 4a is interposed between a lower surface of the sensing element 11 and a lower surface of the heating element 3 on the one hand and an upper surface of the heat spreading element 5.

In some embodiments portions of an intermediate layer 4 are interposed between and enclose the sensing element 11 and the heating element 3. In some embodiments shown in FIGS. 1-4 the intermediate layer 4 at least partially encloses the sensing element 11 and the heating element 3. In some embodiments, an oxide or a nitride layer is used as the intermediate layer 4. In an embodiment, intermediate layer 4 is a layer of SiO2.

In some embodiments, the substrate 2 is a silicon substrate having a semiconductor active area 6 with at least one element of semiconductor circuitry adjacent to an upper surface 2a of the semiconductor substrate 2. In some embodiments, semiconductor substrates such as GaAs or Ge can be used.

A heat spreading element 5 provides thermal coupling between the heating element 3 and the sensing element 1. In some embodiments, heat spreading element 5 has thermal conductivity exceeding that of the intermediate layer 4. In some embodiments the heat spreading element 5 is formed above an insulating layer 8 which is formed above the substrate 2 and positioned below the sensing element 11 and the heating element 3. In some embodiments, the heat spreading element 5 lies adjacent to the upper surface 2a of the substrate 2. In some embodiments, the heat spreading layer 5 is formed from aluminium, aluminium-copper or polycrystalline silicon.

In some embodiments, the sensing element 1 is a magnetoresistive sensing element having at least one magnetic layer 11a, 11c and at least one non-magnetic layer 11b interposed between the magnetic layers 11a, 11c. Depending on type of the magnetoresistive sensing element, different geometries and materials for the magnetic and non-magnetic layers 11a, 11b, 11c can be used. In some embodiments, the non-magnetic layer 11b is formed from one or more materials selected from a group consisting of copper, aluminium, or their alloys. In some embodiments the magnetic layers 11a, 11 c are formed from one or more of a group consisting of iron, nickel, cobalt, and of their alloys. In some embodiments the non-magnetic layer 11b separates vertically two magnetic layers 11a, 11c. In some embodiments the non-magnetic layer 11b separates horizontally two magnetic layers 11a, 11c.

In some embodiments, sensing element 11 comprises one or more magnetoresistive sensing elements selected from the group consisting of an anisotropic magnetoresistive sensing element, a giant magnetoresistive sensing element, colossal magnetoresistive sensing element, an extraordinary magnetoresistive sensing element, and a tunnel magnetoresistive sensing element, depending on the application of the sensing element.

In some embodiments shown in FIG. 1, two heating elements 3 are thermally coupled with the sensing element 1 above the heat spreading element 5. The heat spreading element 5 lies between the upper surface 2a of the substrate 2 and the insulating layer 4a. The lateral dimensions of the heat spreading element 5 are chosen in such a way that it has at least partial lateral overlap with the heating element 3, i.e. a vertical projection of the heat spreading element 5 on a plane parallel to the upper surface of the semiconductor substrate 2 has at least partial overlap with a vertical projection of the heating element 3 on this plane. In some embodiments, the heat spreading element can have at least partial lateral overlap with the sensing element 11.

In some embodiments, tungsten plugs serve as thermal and electrical contact vias 7 in layers connecting the heating element 3 with the heat spreading element 5. In another embodiment of the invention the contact vias are formed of good thermally and electrically conductive material other than tungsten, such as aluminium or copper. In some embodiments, contact vias 7 have higher thermal conductivity than intermediate layer 4a.

In other embodiments, not shown, there is no contact via connecting a sensing element with a heating element. A thermal path to thermally couple the heating element with the sensing element is provided directly through the insulating layer 4a.

In some embodiments, the heating element 3 is an electrically heatable element. In some embodiments the heating element 3 has substantially the same layered structure as the sensing element 11.

In some embodiments, a passivation layer, not shown, as a protection layer is formed on the top of the intermediate layer 4.

Figure 2:
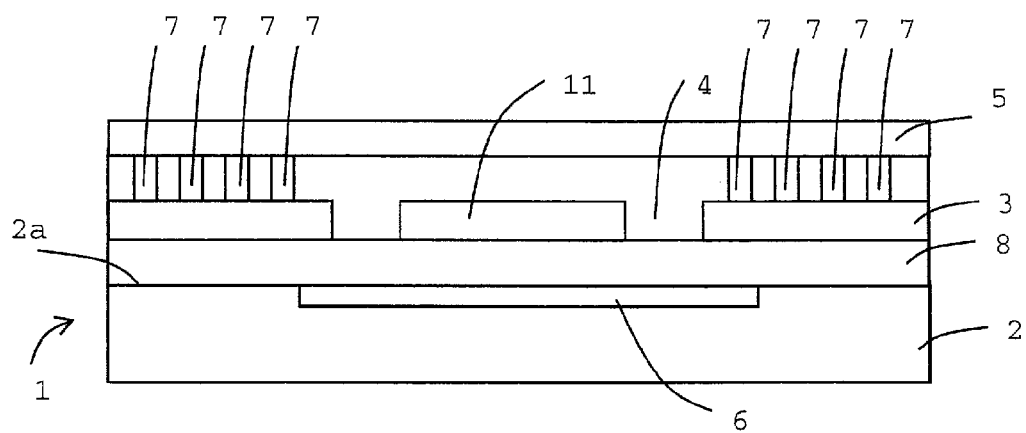
FIG. 2 shows a schematic cross section of some embodiments of the invention.

FIG. 2 shows a schematic cross section of some embodiments. It shows again a sensing element 11 and two heating elements 3. A heat spreading element 5 is above the heating element 3 and the sensing element 11. For the sake of simplicity, the inner structure of the sensing element 11 is not shown. In some embodiments shown in FIG. 2, contact vias 7 couple the heat spreading element 5 to the heating element 3 through the intermediate layer 4. In some embodiments, contact vias 7 serve for thermal coupling of heat spreading element 5 to the heating element 3 through the intermediate layer 4. In some embodiments, contact vias 7 couple thermally and electrically the heat spreading element 5 to the heating element 3 through the intermediate layer 4.

In some embodiments there is no contact via for coupling the sensing element 11 with the heating element 3. The path of thermal coupling is through intermediate layer 4 from the heating element 3 to the heat spreading element 5 and from the heat spreading element 5 to the sensing element 11.

Figure 3:
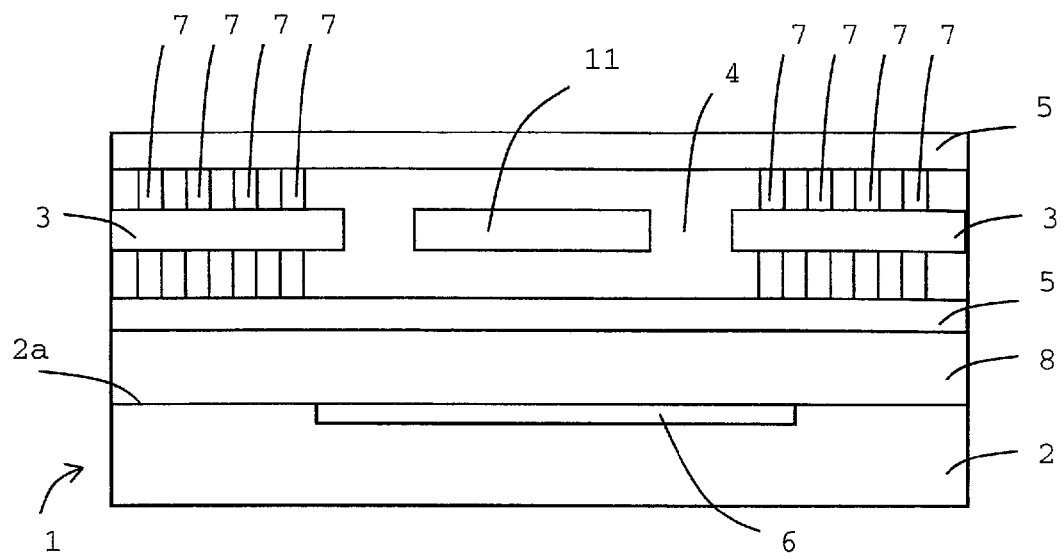
FIG. 3 shows a schematic cross section through some embodiments of the invention.

FIG. 3 shows some embodiments of the invention. It shows two heat spreading elements 5 formed above and below the intermediate layer 4, in which the sensing element 11 and two heating elements 3 are embedded. Contact vias 7 are connecting the heating elements 3 with the heat spreading elements 5. In some embodiments at least one contact via 7 is thermally connecting at least one heating element 3 with at least one heat spreading element 5.

Figure 4:
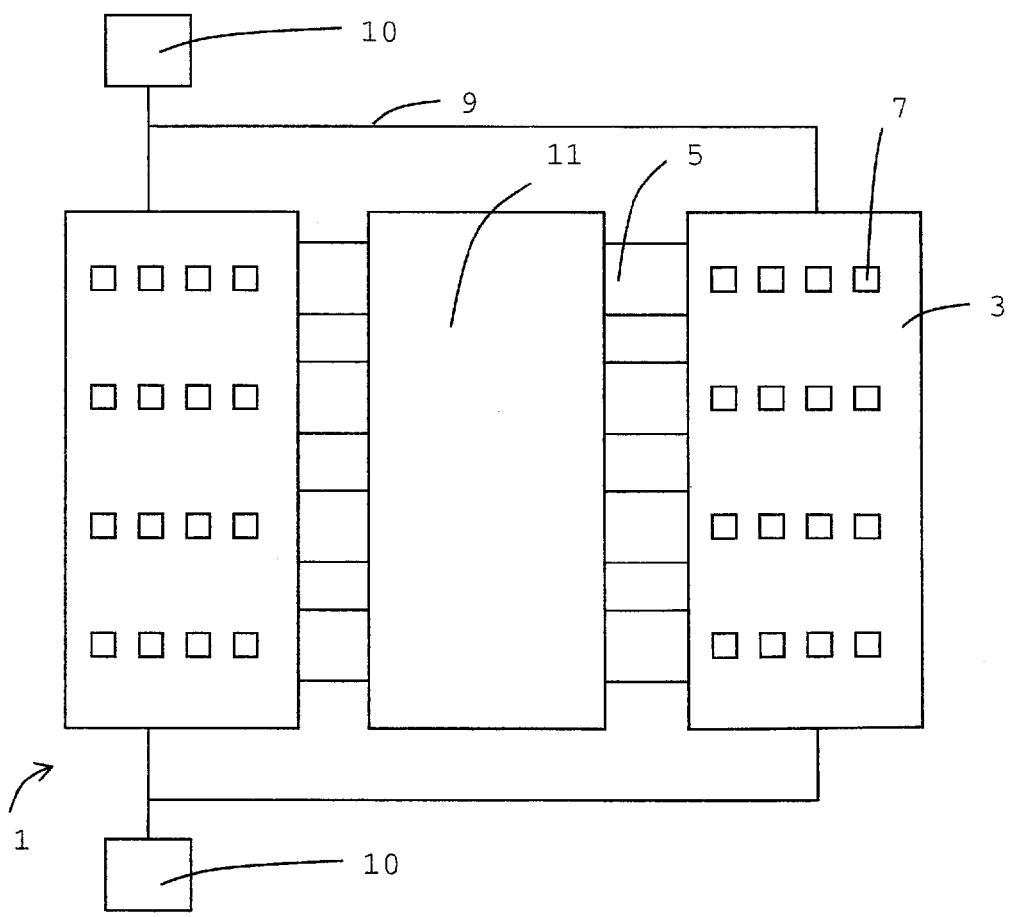
FIG. 4 shows a schematic top-view of an some embodiments of the invention.

FIG. 4 shows a top view of some embodiments shown in FIG. 1. In this view the layout of different elements for some embodiments is shown. It shows also a wiring 9 connected to at least one heating element 3. The wiring 9 is used to apply electric current to heating element 3. For simplicity neither the semiconductor substrate 2 nor a possible read-out circuitry of the sensing element 11 are depicted.

In some embodiments, the heating current is applied through additional circuitry on the same semiconductor substrate 2 for controlling the heating current. In some embodiments, the heating current is applied over an external circuitry coupled to the semiconductor heating element 3 over at least one special contact 10a, 10b. In some embodiments, not shown, the sensing element 11 itself is used for the heating. In this case the heating current is applied directly to the sensing element 11.

In some embodiments, read-out wiring, not shown, is also connected to the sensing element in order to measure its response to the external influence, such as a change in the magnitude or the direction of the external magnetic field. In some embodiments, wiring connects the sensing element to a circuitry for data processing. The circuitry can be at least partially implemented in the active area 6 of the semiconductor substrate 2.

In some embodiments, external circuitry other than that implemented in the active area 6 of the semiconductor substrate 2 is used. In some embodiments, at least one contacting via for connecting a wiring, not shown, with the sensing element 11 or with the heating element 3 is used.

Figure 5:
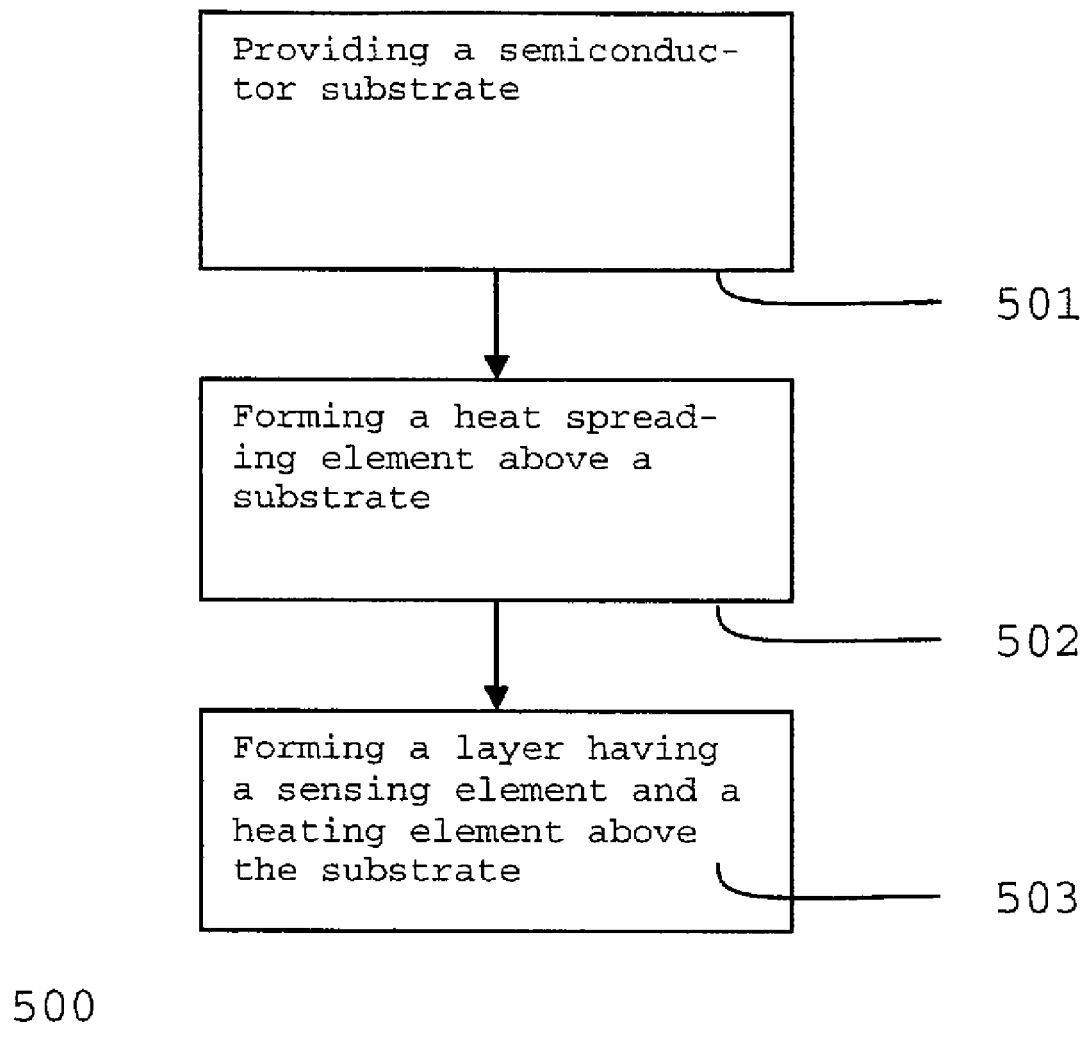
FIG. 5 shows a block diagram of a some embodiments of a method for manufacturing the sensor device.

Some embodiments of the invention are processes of manufacturing the sensor device. FIG. 5 shows a block diagram of some embodiments of methods for manufacturing a sensor device. In the first operation 501 a semiconductor substrate is provided. Afterwards a heat spreading element above the semiconductor substrate 2 is formed in operation 502. For forming the heat spreading element a film deposition technique such as sputtering, evaporation, chemical vapour deposition, lamination with subsequent structuring can be used. For structuring photolithography with etching can be used.

In some embodiments, an insulating layer 8 prior to forming the heat spreading element 5 is formed. In the next operation 503 an intermediate layer 4 having a sensing element 11 and a heating element 3 is formed above the semiconductor substrate 2. In some embodiments, within operation 503 first the sensing element 11 and the heating element 3 are formed. Afterwards the intermediate layer 4 is deposited. For forming the sensing element and the heating element 3 any kind of film deposition technique such as sputtering, evaporation, chemical vapour deposition, lamination etc with subsequent structuring by photolithography and etching can be used.

In some embodiments planarization techniques for planarization of the intermediate layer 4 and the insulating layers 4a, 8 are used. In an embodiment, for planarization chemical-mechanical polishing is used. In some embodiments, as intermediate layer 4 an amorphous borophosphosilicate glass is used.

In some embodiments, not shown, the intermediate layer 4 having a sensing element 11 and a heating element 3 is formed prior to forming a heat spreading element 5 above the semiconductor substrate 2. In some embodiments, an insulating layer 8 above the semiconductor substrate 2 prior to forming the heat spreading element 5 is formed. For creating the insulating layer 8 such deposition methods as chemical vapour deposition, dispensing or sputtering can be used.

In some embodiments, at least one contact via 7 through the insulating layer 8 prior to forming the heat spreading element 5 is formed. Again different kinds of layer formation techniques can such as chemical vapour deposition, dispensing, sputtering etc. can be used. In some embodiments, an insulating layer 4a above the heat spreading element 5 prior to forming the intermediate layer 4 with the sensing element 11 and the heating element 3 is formed.

In some embodiments, at least one contact via 7 through the insulating layer 4 prior to forming the intermediate layer 4 with the heating element 3 and the sensing element 11 is formed. In some embodiments, the semiconductor substrate has a semiconductor active area 6 with at least one element of semiconductor circuitry adjacent to an upper surface 2a of the semiconductor substrate 2.

In some embodiments, conductive wiring above the semiconductor substrate 2 is formed. In some embodiments, at least one contact via 7 for contacting the metal wiring with the sensing element 11 is formed. In some embodiments, at least one contact via 7 for contacting the heating element 3 with the heat spreading element 5 is formed.

In some embodiments, the sensing element 11 in the intermediate layer 4 formed above the substrate is a magnetoresistive sensing element comprising at least one magnetic layer 11a, 11c and at least one non-magnetic layer 11b.

In some embodiments, the sensing element 11 in the intermediate layer 4 formed above the substrate is a sensing element selected from a group consisting of anisotropic magnetoresistive sensing element, giant magnetoresistive sensing element, colossal magnetoresistive sensing element, extraordinary magnetoresistive sensing element, and tunnel magnetoresistive sensing element.

The accompanying drawings that form a part hereof show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

The invention claimed is:

1. A sensor device, comprising:
   a sensing element mounted above a substrate;
   a heating element, mounted substantially coplanar to the sensing element, wherein the heating element is an electrically heatable element; and
   a heat spreading element to thermally couple the sensing element and the heating element, wherein an intermediate layer is interposed between the sensing element and the heating element, at least partially enclosing the sensing element and a heating element, the heat spreading element having a thermal conductivity exceeding the thermal conductivity of the intermediate layer.

2. A sensor device according to claim 1, wherein the heat spreading element is between an upper surface of the substrate and the sensing element.

3. A sensor device according to claim 1, wherein the heat spreading element has at least partial lateral overlap with the heating element.

4. A sensor device according to claim 1, wherein the heat spreading element lies above the sensing element and the heating element.

5. A sensor device according to claim 2, comprising a further heat spreading element above the sensing element and having at least partial lateral overlap with the heating element and the sensing element.

6. A sensor device according to claim 1, comprising at least one vertical via to couple the heating element to the heat spreading element.

7. A sensor device according to claim 6, wherein the vertical via is formed as a tungsten plug.

8. A device according to claim 1, wherein a further heating element is coupled to the sensing element.

9. A sensor device according to claim 1, wherein the sensing element is a magnetoresistive sensing element.

10. A sensor device according to claim 1, wherein the sensing element has at least one magnetic layer and at least one non-magnetic layer.

11. A sensor device, comprising:
    a sensing element mounted above a substrate;
    a heating element, mounted substantially coplanar to the sensing element, wherein the heating element is an electrically heatable element; and
    a heat spreading element to thermally couple the sensing element and the heating element,
    wherein the sensor device includes an intermediate layer which is at least one nonconductive layer, one or more of which is selected from the group consisting of an oxide layer and a nitride layer.

12. A sensor device according to claim 11, wherein the heating element has substantially the same layered structure as the sensing element.

13. A sensor device according to claim 11, wherein the heat spreading layer is one or more layers formed from one or more of the group of materials consisting of aluminum, aluminum-copper or polycrystalline silicon.

14. A sensor device according to claim 1, having an oxide or a nitride layer as the intermediate layer.

15. A sensor device according to claim 14, having a passivation layer as a top layer.

16. A sensor device according to claim 15, comprising at least one contact via for contacting the sensing element.

17. A method of manufacturing a sensor device comprising the following chronologically independent process operations:
    forming a heat spreading element above a substrate;
    forming an intermediate layer having a sensing element and a heating element above the substrate, wherein the sensing element and the heating element are substantially coplanar; and
    forming at least one contact via to contact conductive wiring to the heating element.

18. A method according to claim 17, wherein the heat spreading element is formed prior to forming the intermediate layer having a sensing element and a heating element.

19. A method according to claim 17, wherein an insulating layer is formed above the substrate prior to forming the heat spreading element.

20. A method according to claim 19, wherein a contact via though the insulating layer is formed prior to forming the heat spreading element.

21. A method according to claim 17, wherein the sensing element is a magnetoresistive sensing element comprising at least one magnetic layer and at least one nonmagnetic layer.

* * * * *

UNITED STATES PATENT AND TRADEMARK OFFICE
CERTIFICATE OF CORRECTION

| | | |
|---|---|---|
| PATENT NO. | : 7,633,039 B2 | Page 1 of 1 |
| APPLICATION NO. | : 11/469245 | |
| DATED | : December 15, 2009 | |
| INVENTOR(S) | : Dirk Hammerschmidt et al. | |

It is certified that error appears in the above-identified patent and that said Letters Patent is hereby corrected as shown below:

In column 6, line 49, in Claim 20, delete "though" and insert -- through --, therefor.

Signed and Sealed this

Sixteenth Day of March, 2010

David J. Kappos
*Director of the United States Patent and Trademark Office*